(12) United States Patent
Shu et al.

(10) Patent No.: US 9,729,109 B2
(45) Date of Patent: Aug. 8, 2017

(54) MULTI-CHANNEL AMPLIFIER WITH CHOPPING

(71) Applicant: Analog Devices, Inc., Norwood, MA (US)

(72) Inventors: Marvin L. Shu, Palo Alto, CA (US); Arthur J. Kalb, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/823,678

(22) Filed: Aug. 11, 2015

(65) Prior Publication Data
US 2017/0047896 A1   Feb. 16, 2017

(51) Int. Cl.
| H03F 1/26 | (2006.01) |
|---|---|
| H03F 1/02 | (2006.01) |
| H03F 3/217 | (2006.01) |
| H03F 3/21 | (2006.01) |
| H03F 3/45 | (2006.01) |
| H03F 3/387 | (2006.01) |

(52) U.S. Cl.
CPC ............ *H03F 1/26* (2013.01); *H03F 1/0205* (2013.01); *H03F 3/211* (2013.01); *H03F 3/217* (2013.01); *H03F 3/387* (2013.01); *H03F 3/45076* (2013.01); *H03F 2203/21109* (2013.01); *H03F 2203/45116* (2013.01)

(58) Field of Classification Search
CPC .................................................. H03F 3/45892
USPC ...................................... 330/9; 327/124, 307
See application file for complete search history.

(56) References Cited

U.S. PATENT DOCUMENTS

| 3,988,689 | A | 10/1976 | Ochi et al. |
|---|---|---|---|
| 4,190,805 | A | 2/1980 | Bingham |
| 4,808,942 | A | 2/1989 | Milkovic |
| 5,077,541 | A | 12/1991 | Gilbert |
| 5,258,664 | A | 11/1993 | White |
| 6,262,626 | B1 | 7/2001 | Bakker et al. |
| 6,380,801 | B1 | 4/2002 | McCartney |
| 6,445,248 | B1 | 9/2002 | Gilbert |
| 6,476,671 | B1 | 11/2002 | Tang |
| 6,657,487 | B2 | 12/2003 | Lauffenburger et al. |
| 6,734,723 | B2 | 5/2004 | Huijsing et al. |
| 7,091,771 | B2 | 8/2006 | Thompson et al. |

(Continued)

FOREIGN PATENT DOCUMENTS

WO   WO 2013/123358   8/2013

OTHER PUBLICATIONS

Ng, K. A., et al., "A CMOS analog frontend IC for portable EEG/ECG monitoring applications." IEEE Transactions on Circuits and Systems-I: Regular Papers, vol. 52, No. 11, pp. 2335-2347, Nov. 2005.

(Continued)

*Primary Examiner* — Henry Choe
(74) *Attorney, Agent, or Firm* — Knobbe, Martens, Olson & Bear, LLP

(57) ABSTRACT

Aspects of this disclosure relate to an amplifier with at least two chopper amplifier channels in parallel between a shared input and differential nodes. The amplifier can multiplex outputs of the chopper amplifier channels to provide the output of one or more chopper amplifier channels to the differential nodes at a time. In certain embodiments, this can mask dynamic settling errors.

20 Claims, 7 Drawing Sheets

(56) References Cited

U.S. PATENT DOCUMENTS

| | | | |
|---|---|---|---|
| 7,411,446 B2* | 8/2008 | Kao | H03F 3/45475 327/307 |
| 7,535,295 B1 | 5/2009 | Huijsing et al. | |
| 7,764,118 B2 | 7/2010 | Kusuda et al. | |
| 7,795,960 B2* | 9/2010 | Lyden | H03F 3/387 330/9 |
| 7,834,685 B1* | 11/2010 | Pertijs | H03K 5/2472 327/124 |
| 7,973,596 B2 | 7/2011 | Eschauzier et al. | |
| 8,099,073 B1 | 1/2012 | Muller et al. | |
| 8,120,422 B1 | 2/2012 | Huijsing et al. | |
| 8,405,433 B2 | 3/2013 | Motz et al. | |
| 8,681,029 B1 | 3/2014 | Wang et al. | |
| 8,791,754 B2* | 7/2014 | Lyden | H03G 3/008 330/9 |
| 8,952,751 B2* | 2/2015 | Thomsen | H03F 3/005 330/9 |
| 9,294,037 B2 | 3/2016 | Maurino et al. | |
| 9,496,833 B2 | 11/2016 | Kusuda | |
| 2010/0238058 A1 | 9/2010 | Scaduto | |
| 2011/0316621 A1 | 12/2011 | Burt et al. | |
| 2014/0232456 A1 | 8/2014 | Huijsing et al. | |
| 2015/0270805 A1 | 9/2015 | Maurino et al. | |
| 2015/0288336 A1 | 10/2015 | Kusuda | |

OTHER PUBLICATIONS

Enz, C.C., et al., "Circuit Techniques for Reducing the Effect of Op-Amp Imperfections: Autozeroing, Correlated Double Sampling, and Chopper Stabilization," Proc. of IEEE, vol. 84, No. 9, pp. 1584-1614, Nov. 1996.

Huang, Q. et al., "A 200nV Offset 6.5nV/rtHz Noise PSD 5.6kHz Chopper Instrumentation Amplifier in 1 um Digital CMOS", Solid-State Circuits Conference, pp. 362-363, Feb. 2001.

Denison, T., et. al., "A 2uW 100nV/rtHz Chopper-Stabilized Instrumentation Amplifier for Chronic Measurement of Neural Field Potentials," IEEE Journal of Solid-State Circuits. vol. 42, No. 12, Dec. 2007.

Sakunia, Saket, "Ping-Pong-Pang Instrumentation Amplifier," Dissertation, TU Delft, Sep. 1, 2010.

Analog Devices, AD7910/AD7920 Data Sheet, Rev. C, Sep. 2005. Available at: http://www.analog.com/media/en/technical-documentation/data-sheets/AD7910_7920.pdf (accessed Sep. 10, 2015).

Analog Devices, ADA4522-2 Data Sheet, Rev. 0, May 2015. Available at: http://www.analog.com/media/en/technical-documentation/data-sheets/ADA4522-2.pdf (accessed Sep. 10, 2015).

Bakker et al., "A CMOS Nested-Chopper Instrumentation Amplifier with 100-nV Offset", IEEE Journal of Solid-State Circuits, vol. 35, No. 12, pp. 1877-1883, Dec. 2000.

Burt et al., "A Micropower Chopper-Stabilized Operational Amplifier using a SC Notch Filter with Synchronous Integration inside the Continuous-Time Signal Path", IEEE J. Solid-State Circuits, vol. 41, No. 12, pp. 2729-2736, Dec. 2006.

Coln, Michael, "Chopper Stabilization of MOS Operational Amplifiers Using Feed-Forward Techniques", IEEE Journal of Solid-State Circuits, vol. SC-16, No. 6, Dec. 1981, 4 pages.

Eklund et al., "Digital Offset Compensation of Time-Interleaved ADS Using Random Chopper Sampling", ISCAS 2000—IEEE International Symposium on Circuits and Systems, May 2000, 4 pages.

Fan et al., "A 21nV/√Hz Chopper-Stabilized Multipath Current-Feedback Instrumentation Amplifier with 2µV Offset", IEEE ISSCC Dig. Tech. Papers, Feb. 2010, pp. 80-81.

Fan et al., "Input characteristics of a chopped multi-path current feedback instrumentation amplifier", IEEE IWASI Dig. Tech. Papers, pp. 61-66, Jun. 2011.

Kusuda, Y., "Auto Correction Feedback for Ripple Suppression in a Chopper Amplifier", IEEE J. Solid-State Circuits, vol. 45, No. 8, pp. 1436-1445, Aug. 2010.

LTC1150, Linear Technology, "±15V Chopper Stabilized Operational Amplifier with Internal Capacitors," 1991, 11 pages.

LTC Application Note 21, Linear Technology, "Composite Amplifiers," Jul. 1986, 12 pages.

LTC1150, Linear Technology, "± 15V Zero-Drift Operational Amplifier with Internal Capacitors," 1991, 16 pages.

Nguyen et al., "A Time-Interleaved Chopper-Stabilized Delta-Sigma Analog to Digital Converter", 9th Annual Conference on Electronics, Circuits and Systems, vol. 1, pp. 299-302, Feb. 2002.

Opris et al., "A Rail-to-Rail Ping-Pong Op-Amp", IEEE Journal of Solid-State Circuits, vol. 31, No. 9, Sep. 1996. 5 pages.

Tang et al., "A 3µV-Offset Operational Amplifier with 20nV/√Hz Input Noise PSD at DC Employing both Chopping and Autozeroing" IEEE ISSCC Dig. Tech. Papers, Feb. 2002. 2 pages.

* cited by examiner

MULTI-CHANNEL AMPLIFIER WITH CHOPPING

BACKGROUND

Technical Field

The disclosed technology relates to electronic systems and, more particularly, to amplifiers.

Description of the Related Technology

An amplifier, such as an operational amplifier or an instrumentation amplifier, can include chopper circuitry for reducing the amplifier's input offset voltage. Chopper circuity can periodically reverse polarity of a differential input signal and provide an input to a differential amplifier.

A ping-pong amplifier can include a plurality of amplifiers and alternatingly provide outputs of one or more of the plurality of amplifiers as an output of the ping-pong amplifier. Ping-pong amplifiers can include auto-zeroing and chopping functionalities. While one amplifier of the ping-pong amplifier is active, another amplifier of the ping-pong amplifier disconnected from the ping-pong amplifier output can auto-zero to correct its offset. Chopping can be used in conjunction with an auto-zero ping-pong in order to modulate amplifier flicker noise and auto-zero sampled noise.

Although including auto-zero and/or chopper circuitry in an amplifier can reduce the amplifier's input offset voltage, the auto-zero and/or chopper circuitry can also impact operational performance of the amplifier, for example, by generating output glitches and/or noise.

SUMMARY OF CERTAIN INVENTIVE ASPECTS

One aspect of this disclosure is an apparatus that includes a first chopper amplifier, a second chopper amplifier, differential nodes, a switch network, and a control circuit. The first chopper amplifier is configured to receive a differential input signal and provide a first differential voltage. The second chopper amplifier is configured to receive the differential input signal and provide a second differential voltage. The differential nodes are configured to provide a differential output voltage, wherein the differential output voltage comprises an amplified version of the differential input signal. The control circuit is configured to provide a first chop signal to the first chopper amplifier and provide a second chop signal to the second chopper amplifier, wherein the second chop signal is offset in time relative to the first chop signal. The control circuit is configured to control the switch network to alternatingly electrically couple and electrically decouple the first chopper amplifier to the differential nodes such that the first chopper amplifier is electrically coupled to the differential nodes after the first differential voltage has settled. The control circuit is also configured to control the switch network to alternatingly electrically couple and electrically decouple the second chopper amplifier to the differential nodes such that the second chopper amplifier is electrically coupled to the differential nodes after the second differential voltage has settled.

The first chopper amplifier can include a differential feedback amplifier. The differential feedback amplifier can include a capacitive feedback element disposed between an output terminal and an input terminal of the differential feedback amplifier. The first chopper amplifier can include an input chop circuit and an input capacitor coupled between the input chop circuit and the input terminal of the differential feedback amplifier.

The control circuit can control the switch network to electrically couple the first chopper amplifier to the differential nodes after the first differential voltage has settled responsive to a transition in the first chop signal.

The control circuit can control the switch network to alternatingly electrically couple and electrically decouple the first chopper amplifier to the differential nodes at a higher frequency than a chopping frequency of the first chopper amplifier. For instance, the control circuit can control the switch network to alternatingly electrically couple and electrically decouple the first chopper amplifier to the differential output nodes at about two times a chopping frequency of the first chopper amplifier.

The control circuit can control the switch network to alternatingly electrically couple and electrically decouple the first chopper amplifier to the differential output nodes such that the first chopper amplifier is alternatingly electrically coupled and electrically decoupled from the differential output nodes for approximately equal amounts of time.

The first chopper amplifier can receive a first zero-order hold signal, and the first differential voltage can correspond to an amplified version of a sum of the differential input signal and the first zero-order hold signal. The second chopper amplifier can receive an second zero-order hold signal, and the first differential voltage corresponds to an amplified version of a sum of the differential input signal and the second zero-order hold signal.

The apparatus can further include a third chopper amplifier configured to receive the differential input signal and provide a third differential voltage, wherein the control circuit is configured to control the switch network to electrically couple two of the first chopper amplifier, the second chopper amplifier, and the third chopper amplifier to the differential output nodes at a time.

The switch network can implement an output chop circuit of the first chopper amplifier. Alternatively, the first chopper amplifier can include an output chop circuit, and the switch network can be coupled between the output chop circuit and the differential output nodes.

Another aspect of this disclosure is an apparatus that includes a first chopper amplifier, a second chopper amplifier, differential nodes, a switch network, and a control circuit. The first chopper amplifier is configured to receive a differential input signal and to chop the differential input signal at a first frequency. The first chopper amplifier includes a first differential feedback amplifier that includes a first feedback element electrically coupled between an input terminal of the first differential amplifier and an output terminal of the first differential amplifier. The second chopper amplifier is configured to receive the differential input signal and to chop the differential input signal at the first frequency. The second chopper amplifier includes a second differential feedback amplifier that includes a second feedback element electrically coupled between an input terminal of the second differential amplifier and an output terminal of the second differential amplifier. The differential nodes are configured to provide a differential signal, wherein the differential signal comprises an amplified version of the differential input signal. The control circuit is configured to provide a first chop signal having the first frequency to the first chopper amplifier and provide a second chop signal having the first frequency to the second chopper amplifier, wherein the second chop signal is offset in time relative to the first chop signal. The control circuit is configured to control the switch network to alternatingly electrically couple and electrically decouple the differential nodes and the first differential feedback amplifier at a second frequency, wherein the second frequency is greater than the first frequency. The control circuit is configured to control the switch network to alternatingly electrically couple and electrically decouple the differential nodes and the second differential feedback amplifier at the second frequency.

The first feedback element can include a first passive impedance element, and wherein the second feedback element can include a second passive impedance element. For instance, the first feedback element can include a first capacitor and the second feedback element can include a second capacitor. The first chopper amplifier can include an input chop circuit and a coupling capacitor coupled between the input chop circuit and the input terminal of the first differential feedback amplifier.

The second frequency can be two times the first frequency.

The differential signal can be a differential voltage, and the control circuit can control the switch network to alternatingly electrically couple and electrically decouple the first chopper amplifier to the differential nodes such that the first differential feedback amplifier is electrically coupled to the differential nodes after a differential output voltage of the first differential feedback amplifier has settled.

The control circuit can provide a power down signal to the first differential feedback amplifier to turn off the first differential feedback amplifier for at least a portion of the time that the first differential feedback amplifier is electrically decoupled from the differential nodes.

The apparatus can further include a third chopper amplifier, wherein the control circuit can control the switch network to electrically couple two amplifiers selected from the group of the first chopper amplifier, the second chopper amplifier, and the third chopper amplifier to the differential nodes at a time.

Another aspect of this disclosure is a method of electronic amplification. The method includes providing a differential input signal to a first chopper amplifier and a second chopper amplifier; providing a first chop signal to the first chopper amplifier, wherein the first chopper amplifier has a chop frequency; providing a second chop signal to the second chopper amplifier, wherein the second chopper amplifier has the chop frequency, and wherein the second chop signal is offset in time relative to the first chop signal; alternatingly electrically coupling and electrically decoupling the first chopper amplifier and differential output nodes at a ping-pong frequency, wherein the differential output nodes are configured to provide a differential output voltage comprising an amplified version of the differential input signal, and wherein the ping-pong frequency is two times a chop frequency; and alternatingly electrically coupling and electrically decoupling the second chopper amplifier and the differential output nodes at the ping-pong frequency.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF EMBODIMENTS

Figure 1:
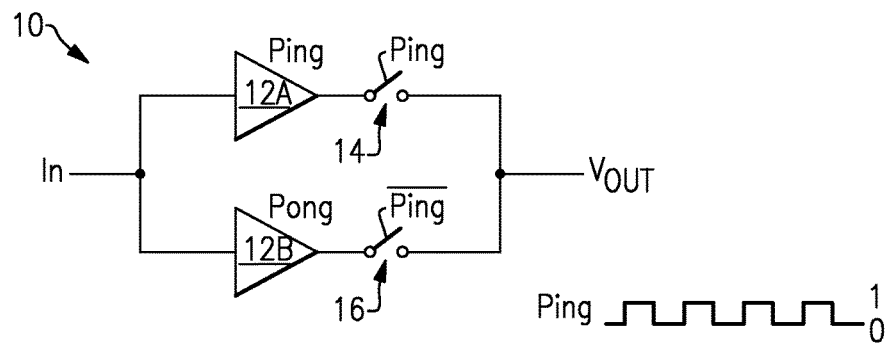
FIG. 1 is a schematic block diagram of a ping-pong amplifier.

The following detailed description of certain embodiments presents various descriptions of specific embodiments of the inventions. However, the inventions can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that embodiments can include more elements than illustrated in a particular drawing and/or embodiments can include a subset of the illustrated elements of a particular drawing.

Chopper amplifiers have encountered various technical challenges. For instance, in certain applications, chopping artifacts due to finite gain and bandwidth of the amplifier and/or charge injection from chopping switches have created issues.

As another example, some recent instrumentation amplifier designs have suffered from relatively larger chopping settling errors when the entire instrumentation amplifier system is chopped. These issues have been observed in certain low-power, low-noise complementary metal oxide semiconductor (CMOS) instrumentation amplifiers, for example. When chopping switches are moved outside of gain-setting components of an amplifier, desirable common-mode rejection ratio (CMRR) performance can be achieved. However, such designs can encounter dynamic settling issues. These settling issues can be particularly problematic with capacitive feedback amplifiers. In some instances, chopper amplifiers can drive outputs with a band-limited version of a chopped input signal, which can result in a relatively large output error.

A standard method of reducing dynamic errors can involve making dynamic settling errors as short as possible by increasing amplifier bandwidth. However, such an approach may increase amplifier bandwidth more than otherwise desired. This can undesirably increase power consumption. Further, dynamic settling errors can still remain on the system output with a relatively shorter duration.

Dead-banding, in which a system output is left floating after a chop transition until the amplifier has sufficiently recovered from the chopping artifact has been implemented in certain applications. Dead-banding can involve sampling a system output while it is valid prior to an occurrence of dynamic error, and holding the system output at the sampled level for the duration of the dynamic error. Accordingly, dead-banding may create relatively large errors if a signal changes significantly during the dead-band period. Dead-banding can be implemented in both chopping and auto-zero periods of a chopper amplifier. However, dead-banding can be unsuitable for providing a continuous-time output and in some other applications.

Aspects of this disclosure relate to multiplexing outputs of two or more parallel chopper amplifiers that are coupled in paths between a shared input and a common output. Such multiplexing can implement ping-pong techniques in connection with chopper amplifiers. A ping-pong technique can mask dynamic settling errors, which may be generated in chopper amplifiers. This technique may also be used to mask auto-zero periods and/or any other period in which the amplifier output error is relatively large.

A chopper amplifier output provided to the common output can be selected based at least partly on a phase of a clock signal. Dynamic settling errors can be masked by providing a settled output of a selected amplifier of the two or more parallel amplifiers to the common output.

Each parallel amplifier can include chopping circuitry and a differential amplifier. A multiplexer can selectively electrically couple a selected differential amplifier to the common output. A switch network can implement a multiplexer. In some instances, the switch network can also implement some or all of the chopping circuitry. The chopping circuitry can reverse polarity of a differential input signal provided to each differential amplifier at a first frequency. The chopping circuitry can also reverse polarity of a differential output of each of the differential amplifiers. The multiplexer can alternatingly electrically couple and electrically decouple each differential amplifier from the common output at a second frequency. The second frequency can be higher than the first frequency. For instance, the second frequency can be two times the first frequency.

A differential output voltage can be provided to the common output. According to certain embodiments, the two or more parallel amplifiers are each differential feedback amplifiers. In some of these embodiments, the two or more parallel amplifiers can each be differential amplifiers with capacitive feedback elements. The principles and advantages discussed herein can be applied to variety of chopper amplifier architectures, which can include auto-zero features and/or zero-order hold features in various implementations.

FIG. 1 is a schematic block diagram of an illustrative ping-pong amplifier 10. The ping-pong amplifier 10 of FIG. 1 includes a first amplifier 12A, a second amplifier 12B, a first switch 14, and a second switch 16. In FIG. 1, two parallel amplifiers 12A and 12B are in parallel between a shared input IN and a common output $V_{OUT}$. Each of the parallel amplifiers 12A and 12B can be chopper amplifiers. A switch network can include the first switch 14 and the second switch 16. The first switch 14 and the second switch 16 can alternatingly provide the output of the first amplifier 12A and the output of the second amplifier 12B to the common output $V_{OUT}$. In particular, the first switch 14 can electrically couple the output of the first amplifier 12A to the common output $V_{OUT}$ while the second switch 16 electrically decouples (or electrically isolates) the output of the second amplifier 12B from the common output $V_{OUT}$ during a first phase of a ping-pong signal Ping. During the second phase of the ping-pong signal Ping, the first switch 14 can electrically decouple the output of the first amplifier 12A from the common output $V_{OUT}$ while the second switch 16 electrically couples the output of the second amplifier 12B to the common output $V_{OUT}$. The ping-pong signal Ping can be a periodic signal with a ping-pong frequency. The ping-pong signal Ping can be a clock signal with a 50% duty cycle as shown by the waveform in FIG. 1.

Figure 2A:
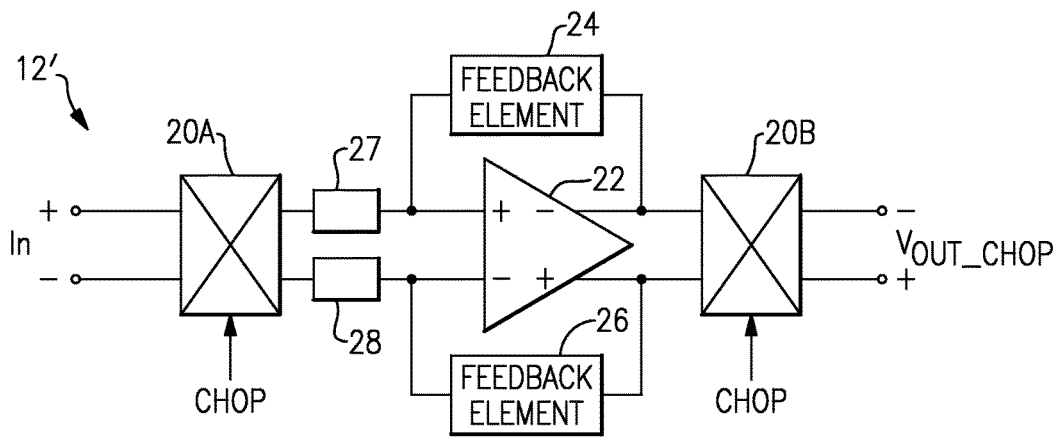
FIG. 2A is a schematic diagram of an illustrative chopper amplifier of the ping-pong amplifier of FIG. 1 according to an embodiment.

As discussed above, each of the amplifiers 12A and 12B can be chopper amplifiers. FIG. 2A is a schematic diagram of an illustrative chopper amplifier 12' of the ping-pong amplifier 10 of FIG. 1 according to an embodiment. The first amplifier 12A and the second amplifier 12B of FIG. 1 can each be implemented by a chopper amplifier 12' that receives a different chop signal. The chopper amplifier 12' provides a differential output voltage $V_{OUT\_CHOP}$.

The illustrated chopper amplifier 12' includes an input chop circuit 20A, input elements 27 and 28, a differential feedback amplifier that includes a differential amplifier 22 and feedback elements 24 and 26, and an output chop circuit 20B. The input chop circuit 20A can switch polarity of a differential signal provided to the input of the differential amplifier 22. When the chop signal Chop is in a first phase, the differential signal provided to the input of the differential amplifier 22 can have a first polarity. When the chop signal Chop is in a second phase, the differential signal provided to the input of the differential amplifier 22 can have a second polarity that is opposite the first polarity. The first input element 27 can be disposed between a first output of the input chop circuit 20A and the non-inverting input terminal of the differential amplifier 22. The second input element 28 can be disposed between a second output of the input chop circuit 20A and the inverting input terminal of the differential amplifier 22. The first input element 27 and the second input element 28 can be any suitable circuit elements. For instance, the input elements 27 and 28 can each include a passive impedance element, such as a capacitor, a resistor, or an inductor. In certain instances, the input elements element 27 and/or 28 can include two or more passive impedance elements in series and/or in parallel.

The differential amplifier 22 can amplify the differential signal received at its inputs and provide an amplified differential signal at its outputs. A first feedback element 24 can be electrically coupled between an inverting output of the differential amplifier 22 and a non-inverting input of the differential amplifier 22. A second feedback element 26 can be electrically coupled between a non-inverting output of the differential amplifier 22 and an inverting input of the differential amplifier 22. The feedback elements 24 and 26 can be any suitable feedback elements. For instance, the feedback elements 24 and 26 can each include a passive impedance element, such as a capacitor, a resistor, or an inductor. In certain instances, the feedback element 24 and/or the feedback element 26 can include two or more passive impedance elements in series and/or in parallel.

The chopper amplifier 12' can provide a differential output voltage $V_{OUT\_CHOP}$ across differential output nodes. The output chop circuit 20B can switch polarity of the differential output voltage $V_{OUT\_CHOP}$ by alternatingly switching connections between the differential output nodes and the inverting and non-inverting outputs of the differential amplifier 22. The output chop circuit 20B can adjust connections responsive to the chop signal Chop toggling.

Figure 2B:
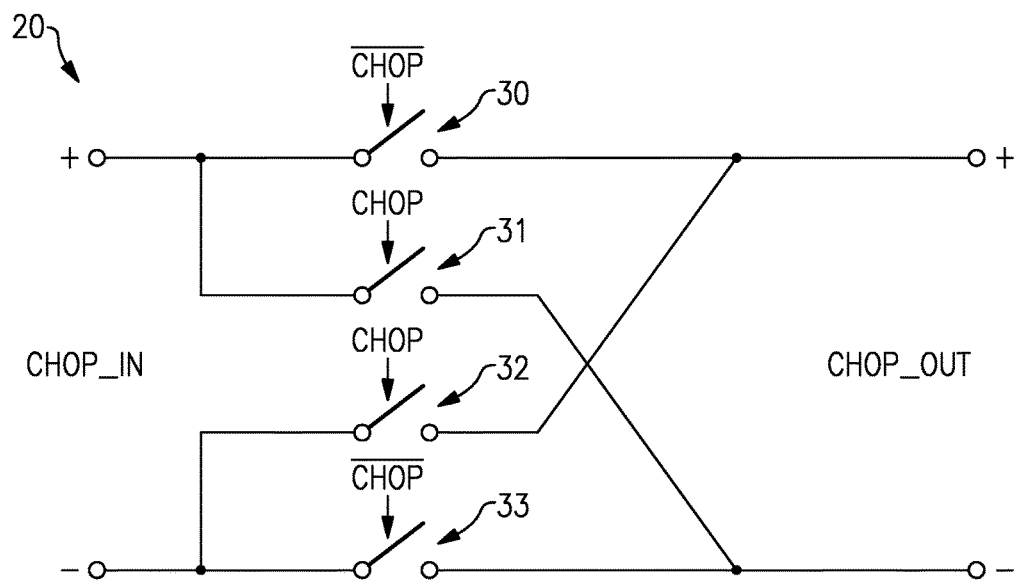
FIG. 2B is a schematic diagram of an illustrative chopper circuit of the chopper amplifier of FIG. 2A according to an embodiment.

FIG. 2B is a schematic diagram of an illustrative chopper circuit 20 of the chopper amplifier 12' of FIG. 2A according to an embodiment. The chopper circuit 20 of FIG. 2B is also an example implementation of other chopper circuits discussed herein. The chopper circuit 20 can implement the input chop circuit 20A of FIG. 2A. Another instantiation of the chopper circuit 20 can implement the output chop circuit 20B of FIG. 2A. As illustrated, the chop circuit 20 includes a first switch 30, a second switch 31, a third switch 32, and a fourth switch 33. The chop circuit 20 can chop a differential input signal Chopin by alternatingly switching connections between differential input nodes and differential outputs during each chopping cycle. The chop signal Chop can be a periodic signal and the illustrated chopping circuit 20 can operate in one state for one phase of the chop signal Chop and operate in another state for another phase of the chop signal Chop during each period.

The chop circuit 20 can change state responsive to a chop signal Chop toggling. In a first state, the chop circuit 20 can electrically connect a positive input node Chop_In+ to a positive output node Chop_Out+ and electrically connect a negative input node Chop_In– to a negative output node Chop_Out–. The first switch 30 and the fourth switch 33 can be ON in the first state and the second switch 31 and the third switch 32 can be OFF in the first state. In a second state, the chop circuit 20 can reverse the connections between the differential input Chopin and the differential output Chop_Out relative to the first state. In the second state, the chop circuit 20 can electrically connect a positive input node Chop_In+ to a negative output node Chop_Out– and electrically connect a negative input node Chop_In– to a positive output node Chop_Out+. The first switch 30 and the fourth switch 33 can be OFF in the second state and the second switch 31 and the third switch 32 can be ON in the second state.

The chop signal Chop of the chopper circuits of FIGS. 2A and 2B can have a defined relationship relative to the ping-pong signal Ping of ping-pong amplifier 10 FIG. 1. The chop signal Chop can have a first frequency and the ping-pong signal Ping can have a second frequency, in which the second frequency is greater than the first frequency. In certain embodiments, a ping-pong frequency of the ping-pong signal Ping can represent the rate at which the output of the ping-pong amplifier 10 is switched between outputs of the first amplifier 12A and the output of the second amplifier 12B. In these embodiments, the ping-pong frequency can be approximately two times a chopping frequency, which can be a rate at which chopping occurs in each chopper amplifier 12A and 12B. Accordingly, for each period of the chop signal Chop there can be two periods of the ping-pong signal Ping. In certain embodiments, the chop signals in the first chopper amplifier 12A and the second chopper amplifier 12B can be offset by approximately one quarter of a chopping cycle. The ping-pong frequency and the chopping frequency can be aligned such that each chopper amplifier 12A and 12B is active in the latter part of its chopping cycle.

Figure 3:
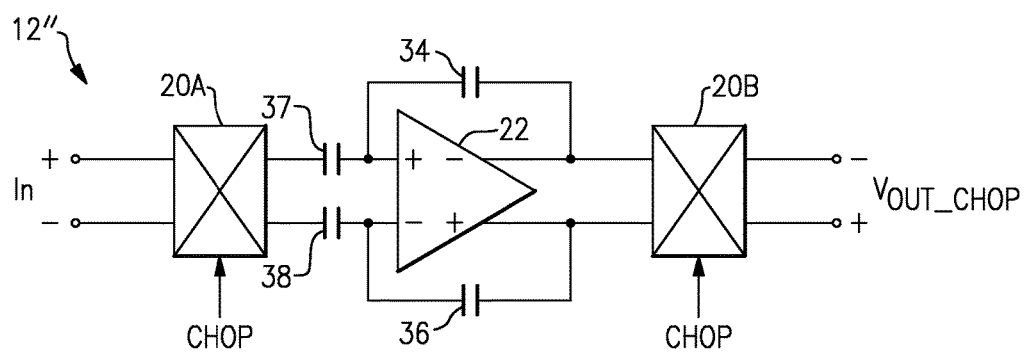
FIG. 3 is a schematic diagram of another illustrative chopper amplifier of the ping-pong amplifier of FIG. 1 according to an embodiment.

FIG. 3 is a schematic diagram of illustrative chopper amplifier 12" of the ping-pong amplifier 10 of FIG. 1 according to another embodiment. The first amplifier 12A and the second amplifier 12B of FIG. 1 can each be implemented by a chopper amplifier 12" that receives a different chop signal. The chopper amplifier 12" of FIG. 3 an example of the chopper amplifier 12' of FIG. 2A, in which the input elements 27 and 28 are implemented by input coupling capacitors 37 and 38, respectively, and the feedback elements 24 and 26 are implemented by feedback capacitors 34 and 36, respectively. The differential feedback amplifier of FIG. 3 can receive a differential signal as an input and provide a differential voltage as an output. The differential feedback amplifier of FIG. 3 can be a capacitive feedback instrumentation amplifier.

As illustrated in FIG. 3, a first feedback capacitor 34 can be electrically coupled between an inverting output of the differential amplifier 22 and a non-inverting input of the differential amplifier 22. A second feedback capacitor 36 can be electrically coupled between a non-inverting output of the differential amplifier 22 and an inverting input of the differential amplifier 22. With feedback capacitors 34 and 36, the feedback amplifier can provide a differential voltage as an output. The feedback capacitors 34 and 36 together with the differential amplifier 22 can implement a transimpedance amplifier that receives a current as an input and provides a voltage as an output.

In FIG. 3, a first input coupling capacitor 37 is electrically coupled between a positive output of the input chop circuit 20A and a non-inverting input of the differential amplifier 22. Similarly, in FIG. 3, a second input coupling capacitor 38 is electrically coupled between a negative output of the input chop circuit 20A and an inverting input of the differential amplifier 22.

Figure 4A:
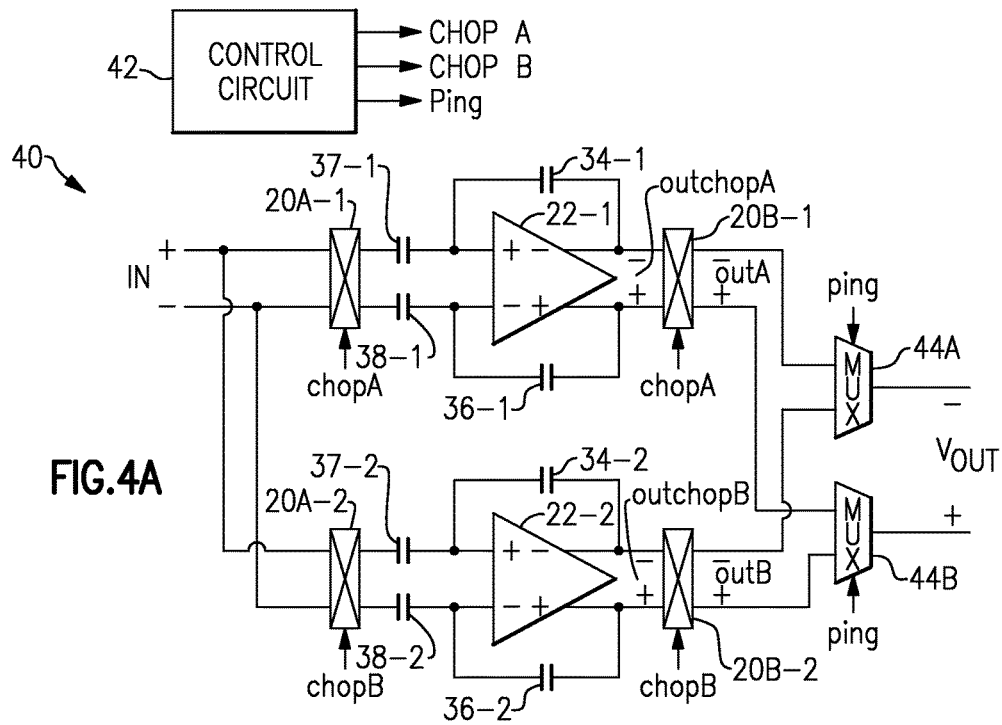
FIG. 4A is a schematic diagram of a ping-pong amplifier according to an embodiment.
Figure 4B:
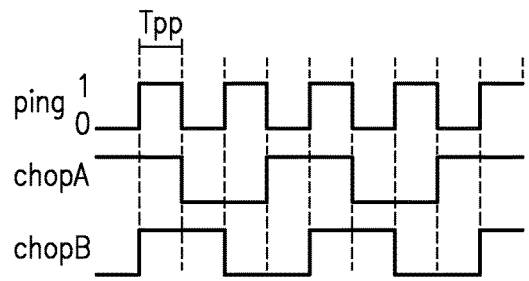
FIG. 4B is a timing diagram of example ping-pong and chop signals of the ping pong amplifier of FIG. 4A.
Figure 4C:
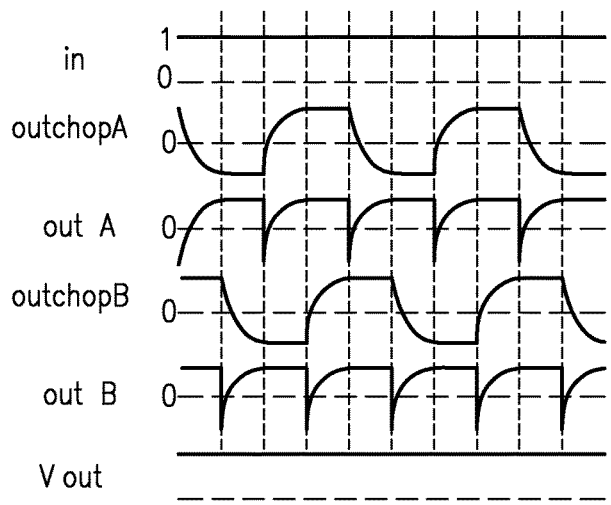
FIG. 4C is a timing diagram of example signals at various nodes of the ping-pong amplifier of FIG. 4A illustrated in alignment with the timing of the select and chop signals of FIG. 4B.

FIG. 4A is a schematic diagram of a ping-pong amplifier 40 according to an embodiment. FIG. 4B is a timing diagram of example select and chop signals of the ping-pong amplifier 40. FIG. 4C is a timing diagram of example signals at various nodes of the ping-pong amplifier 40 illustrated in alignment with the timing of the select and chop signals of FIG. 4B.

The illustrated ping-pong amplifier 40 includes two parallel channels between a shared input In and a common output $V_{OUT}$. Each channel of the ping-pong amplifier 40 includes a chopper amplifier of FIG. 3. A control circuit 42 can provide chop signals Chop A and Chop B and a ping-pong signal Ping to the ping-pong amplifier 40. The control circuit 42 can be any suitable circuit configured to generate such signals. For instance, the control circuit 42 can be any suitable circuit configured to generate the signals illustrated in FIG. 4B.

Compared with an amplifier having a single chopper amplifier channel, the ping-pong amplifier 40 could consume about twice the power and area if the channel design is not modified relative to a single chopper amplifier channel. In some amplifiers, however, significant determinants of power consumption can be the bandwidth and/or settling performance for relatively short dead-times. In such cases, settling requirements and/or power consumption may be reduced significantly using a ping-pong amplifier having multiple chopper amplifier channels. According to certain embodiments of a ping-pong amplifier having multiple chopper amplifier channels, outputs of chopping channels can have a settling requirement of about one quarter of a chopping cycle. In such embodiments, the chopping frequency can primarily be determined by an input signal bandwidth and a flicker noise corner. Therefore, some systems may achieve lower power with two slower chopper amplifier channels in a ping-pong configuration than a single higher speed channel. A ping-pong amplifier with two chopper amplifier channels can also provide a continuous output, which may be problematic for an amplifier having a single channel chopper amplifier channel.

FIGS. 4B and 4C are example timing diagrams of signals of the ping-pong amplifier 40 that can achieve lower power and/or have less stringent settling requirements than an amplifier having a single chopper amplifier channel. As illustrated in FIG. 4B, the ping-pong signal Ping and the chop signals Chop A and Chop B can each be periodic signals. The ping-pong signal Ping can have twice frequency of the chop signals Chop A and Chop B. The chop signals Chop A and Chop B can have substantially the same frequency and can be offset in time from each other by approximately one quarter of the period of the chop signals.

Referring back to FIG. 4A, multiplexers 44A and 44B are coupled between differential outputs of the parallel chopper amplifier channels and the common differential output $V_{OUT}$ of the ping-pong amplifier 40. The multiplexers 44A and 44B can selectively electrically connect the differential output of one of the parallel chopper amplifier channels to the differential output $V_{OUT}$ of the ping-pong amplifier 40 responsive to the ping-pong signal Ping. The control circuit 42 can provide the ping-pong signal Ping with the timing shown in FIG. 4B to the multiplexers 44A and 44B to alternatingly electrically couple and electrically decouple the first differential amplifier 22-1 to the differential output $V_{OUT}$. In particular, the multiplexers 44A and 44B can electrically couple the first differential amplifier 22-1 to the differential output $V_{OUT}$ when the ping-pong signal Ping is in one state (e.g., logic 1) and electrically decouple the first differential amplifier 22-1 from the differential output $V_{OUT}$ when the ping-pong signal Ping is an another state (e.g., logic 0). Similarly, the multiplexers 44A and 44B can alternatingly electrically couple and electrically decouple the second differential amplifier 22-2 to the differential output $V_{OUT}$.

When the ping-pong signal Ping is in a first state, the multiplexers 44A and 44B can electrically connect the differential output $V_{OUT}$ of the ping-pong amplifier 40 to a differential output of a first channel of the parallel chopper amplifier channels and electrically decouple the differential output $V_{OUT}$ of the ping-pong amplifier 40 from a differential output of a second channel of the parallel chopper amplifier channels. When the ping-pong signal Ping is in a second state, the multiplexers 44A and 44B can electrically connect the differential output $V_{OUT}$ of the ping-pong amplifier 40 to the differential output of the second channel of the parallel chopper amplifier channels and electrically decouple the differential output $V_{OUT}$ of the ping-pong amplifier 40 from the differential output of the first channel of the parallel chopper amplifier channels.

FIG. 4C illustrates signals at nodes of the chopper amplifier channels of the ping-pong amplifier 40 when a direct current (DC) input signal IN is provided. In FIG. 4C, the settling time for each channel is approximately $T_{PP}$, which is half of the period of the illustrated ping-pong signal Ping and one quarter of the period of the illustrated chopping signals Chop A and Chop B. For instance, the outputs $Out_A$ and $Out_B$ of the parallel chopper amplifier channels take about one quarter of the period of the illustrated chopping signals to settle at a voltage level. When the ping-pong signal Ping is at a logic 1 level in FIG. 4B, the differential output $V_{OUT}$ of the ping-pong amplifier 40 can be electrically connected to the differential output $Out_A$ of the first channel. In this example, when the ping-pong signal Ping is at a logic 0 level in FIG. 4B, the differential output $V_{OUT}$ of the ping-pong amplifier 40 can be electrically connected to the differential output $Out_B$ of the second channel.

As shown in FIGS. 4B and 4C, the differential output voltage of each channel can settle before it is provided to the differential output $V_{OUT}$ of the ping-pong amplifier 40. In particular, when the ping-pong signal Ping is at a logic 1, the differential output voltage $Out_A$ of the first channel has settled. Similarly, when the ping-pong signal Ping is at a logic 0, the differential output voltage $Out_B$ of the second channel has settled. Accordingly, the timing of the chopping signals Chop A and Chop B and the ping-pong signal Ping can mask dynamic settling errors in the ping-pong amplifier 40. With the timing of the signals in FIG. 4B, the settling speed of each chopper amplifier channel and the settling requirements of the differential output signal $V_{OUT}$ of the chopper amplifier can be unrelated.

The output chop circuits 20B-1 and 20B-2 and the multiplexers 44A and 44B are illustrated as separate circuits in FIG. 4A to show their logical functions for illustrative purposes. However, any suitable switch network can implement the logical functions of both the output chop circuits 20B-1 and 20B-2 and the multiplexers 44A and 44B. Such a switch network can also implement the input chop circuits 20A-1 and 20A-2 with additional switches in certain applications.

Figure 4D:
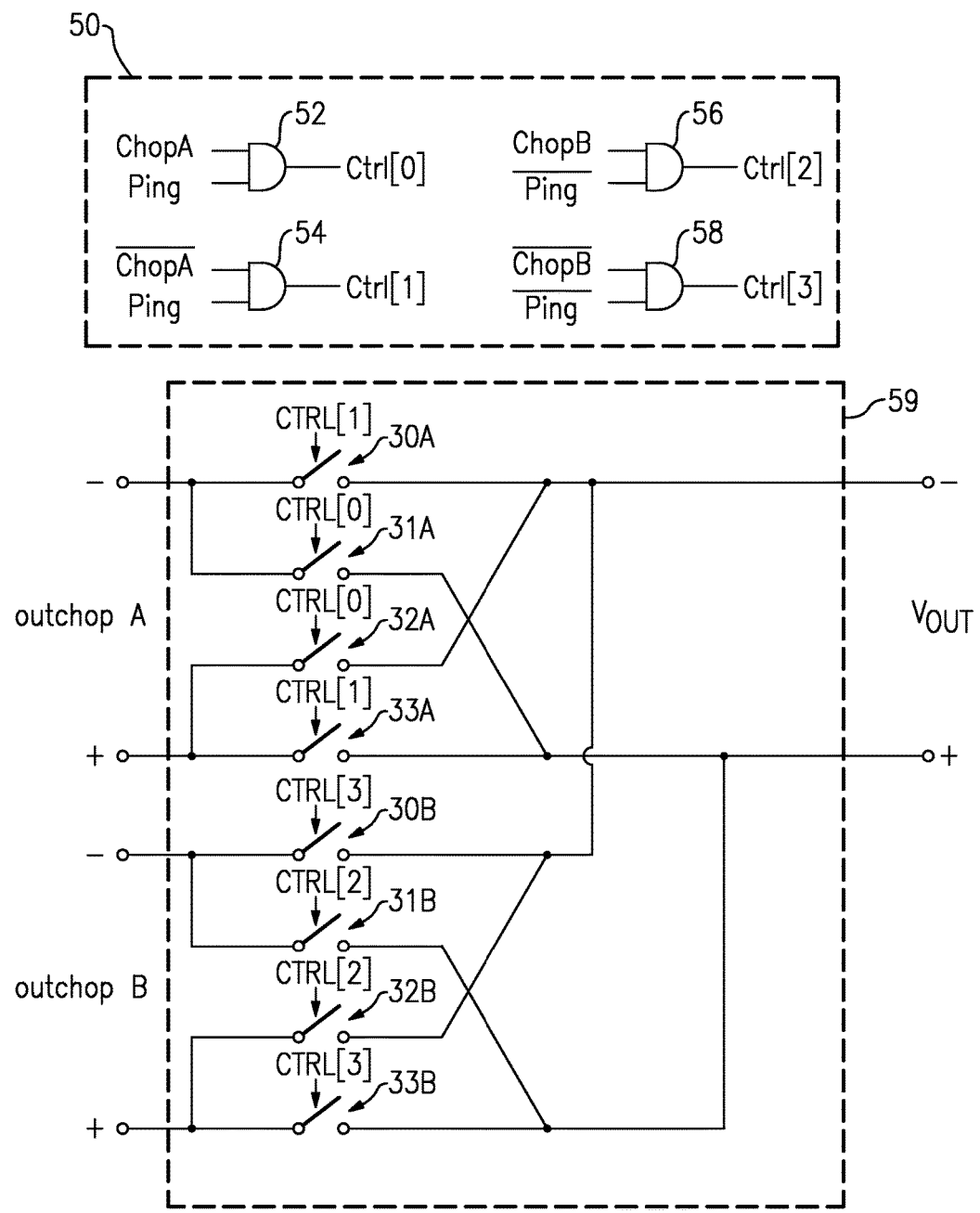
FIG. 4D is schematic diagram of a control circuit and switch network according to an embodiment.

FIG. 4D is schematic diagram of a control circuit 50 and switch network 59 configured to implement the functionality of both the output chop circuits 20B-1 and 20B-2 and the multiplexers 44A and 44B. The control circuit 50 can provide control signals Ctrl[0]-Ctrl[3] to control switches of the switch network 59. These control signals Ctrl[0]-Ctrl[3] can control the switches of the switch network 59 to implement the chopping and multiplexing that are logically illustrated in FIG. 4A.

The control circuit 50 is configured to generated control signals Ctrl[0]-Ctrl[3] based on combinations of the chop signals Chop A and Chop B and the ping-pong signal Ping. The chop signals Chop A and Chop B and the ping-pong signal Ping of FIG. 4D can have the timing relationship illustrated in FIG. 4B, for example. While the control circuit 50 is illustrated as including 4 AND gates for illustrative purposes, any other suitable circuit configured to provide equivalent control signals can alternatively be implemented in place of the control circuit. Logical complements of the chop signals Chop A and/or Chop B and/or the ping-pong signal Ping can be generated using an inverter and/or by other suitable logic.

The switch network 59 includes switches 30A to 33A that function similarly to the chop circuit 20 of FIG. 2B, except that the switches 30A to 33A receive different control signals than the switches 30 to 33, respectively, of FIG. 2B. Similarly, the switch network 59 includes switches 30B to 33B that function similarly to the chop circuit 20 of FIG. 2B, except that the switches 30B to 33B receive different control signals than the switches 30 to 33, respectively, of FIG. 2B. According to an embodiment, the switch network 59 can receive the output signals outchopA and outchopB of the differential amplifiers 22-1 and 22-2, respectively, of FIG. 4A having the timing illustrated in FIG. 4C and provide a differential output voltage $V_{OUT}$ illustrated in FIG. 4C.

In certain embodiments, ping-pong amplifiers can include power management for one or more of the parallel chopper amplifier channels. Each chopper amplifier can be selectively powered up and selectively powered down within each ping-pong cycle to reduce power consumption relative to having the chopper amplifier on during the entire ping-pong cycle. If each parallel chopper amplifier channel settles in a settling time $T_{SETTLE}$ that is less than a time $T_{PP}$ that the chopper amplifier channel is electrically decoupled from the output of the ping-pong amplifier 40, then each channel can be powered down at the start of the inactive ping-pong phase for an amount of time corresponding to a difference between the time the time $T_{PP}$ that the chopper amplifier channel is electrically connected to the output of the ping-pong amplifier 40 and the settling time $T_{SETTLE}$.

Figure 5:
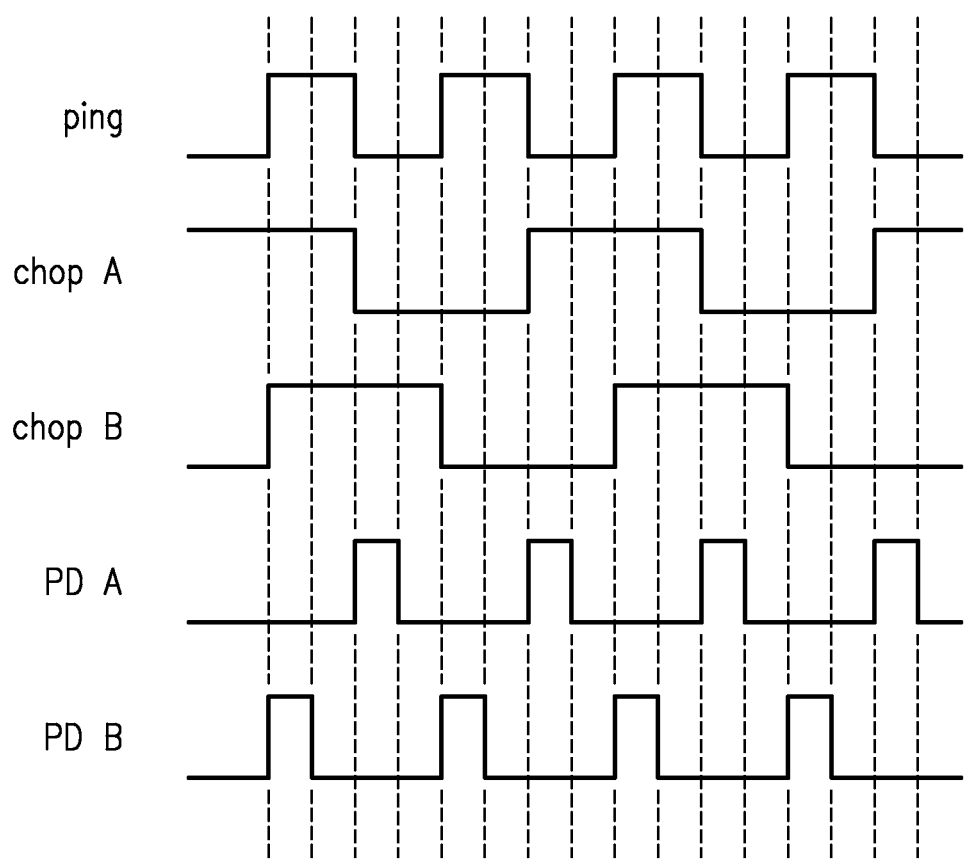
FIG. 5 is a timing diagram that illustrates an example timing relationship between the ping-pong, chop signals, and power down signals in an embodiment of the ping-pong amplifier of FIG. 4A.

FIG. 5 is a timing diagram that illustrates an example timing relationship between the ping-pong signal Ping, chop signals Chop A and Chop B and power down signals $PD_A$ and $PD_B$ in an embodiment of the ping-pong amplifier 40 of FIG. 4A. In FIG. 4A, the first chopper amplifier channel can be powered down responsive to a first power down signal $PD_A$ being asserted (e.g., at a logic 1 value in FIG. 5) and the second chopper amplifier channel can powered down responsive to a second power down signal $PD_B$ being asserted (e.g., at a logic 1 value in FIG. 5). Such power management can cause power consumption of the ping-pong amplifier 40 to be reduced. The first power down signal $PD_A$ can be generated by the control circuit 42 of FIG. 4A and provided to the first differential amplifier 22-1 of FIG. 4A. Similarly, the second power down signal $PD_B$ can be generated by the control circuit 42 of FIG. 4A and provided to the second differential amplifier 22-2 of FIG. 4A. As shown in FIG. 5, the power down signal for each channel can be asserted at the beginning of the inactive ping-pong phase and then de-asserted with sufficient time such that the corresponding chopper amplifier channel can settle before being electrically connected to the differential output nodes of the ping-pong amplifier 40.

Any of the principles and advantages of ping-pong amplifiers discussed herein can be implemented in connection with auto-zeroing of one or more parallel chopper amplifier channels. As one example, auto-zeroing can be implemented in each channel of the ping-pong amplifier 40 of FIG. 4A with auto-zero pulses that can be asserted at times corresponding to the power down signals $PD_A$ and $PD_B$ of FIG. 5. The auto-zero phase of each channel can take place when the channel is inactive and the output of the ping-pong amplifier can remain continuous. Auto-zeroing can assist in achieving a desired functionality of a chopper amplifier that includes a differential feedback amplifier with capacitive feedback, such as the chopper amplifiers of FIG. 4A. In chopped systems, auto-zeroing is typically performed less often than the chopping frequency, and some systems may perform auto-zeroing with a significantly lower frequency. In ping-pong cycles of an amplifier with auto-zeroing in which auto-zero does not occur, a dummy auto-zero state may be used to maintain a regular timing between each ping-pong cycle. Moreover, the power management techniques discussed above and auto-zero technique may be combined in a channel by powering down at the start of the inactive time, powering up, auto-zeroing, and then providing masked settling time that is sufficiently long to accommodate all of these periods. Similarly, other actions which have settling times and/or invalidate the channel output may occur during an inactive phase, as long as the channel output settles by the start of its active phase.

Any of the principles and advantages discussed herein can be implemented in a ping-pong amplifier configured to sum a continuous input with a zero-order hold signal. Such a zero-order hold signal can be, for example, a digital-to-analog converter output. Reproducing a relatively rapid step transition in the continuous input and/or the zero-order hold signal can be challenging for relatively low-power amplifiers. Two low-impedance signals can be multiplexed to produce a step. This multiplexing may be implemented in conjunction with a ping-pong amplifier with multiple parallel chopper amplifier channels to reproduce a zero-order hold signal at the rate of approximately the two times the period of the ping-pong signal.

Figure 6A:
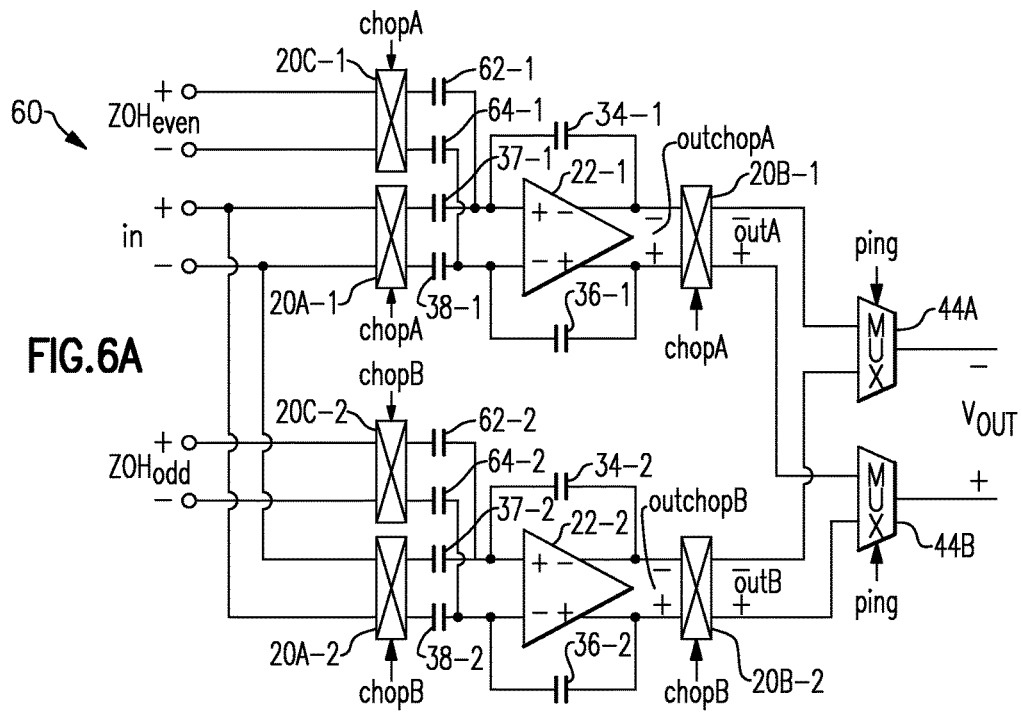
FIG. 6A is a schematic diagram of a ping-pong amplifier according to an embodiment.

FIG. 6A is a schematic diagram of a ping-pong amplifier 60 according to an embodiment. Each chopper amplifier channel of the ping-pong amplifier 60 can include a summing amplifier with two inputs. The first input to each channel can be a continuous time signal In, such as the common input In of the ping-pong amplifier 40 of FIG. 4A. The second input to the first channel can be a first zero-order hold signal $ZOH_{EVEN}$ and the second input to the second channel can be a second zero-order hold signal $ZOH_{ODD}$. The ping-pong amplifier 60 of FIG. 6A can be similar to the ping-pong amplifier 40 of FIG. 4A, except that the ping-pong amplifier 60 includes additional circuitry to provide zero-order hold signals to input terminals of the differential amplifiers 22-1 and 22-2.

As illustrated in FIG. 6A, the first channel includes an input chop circuit 20C-1 configured to chop the first zero-order hold signal $ZOH_{EVEN}$. This chopped signal can be provided to input terminals of the differential amplifier 22-1 by way of input capacitors 62-1 and 64-1. As illustrated in FIG. 6A, the second channel includes an input chop circuit 20C-2 configured to chop the second zero-order hold signal $ZOH_{ODD}$. This chopped signal can be provided to input terminals of the differential amplifier 22-2 by way of input capacitors 62-2 and 64-2.

Figure 6B:
FIG. 6B is a timing diagram of example ping-pong and chop signals of the ping pong amplifier of FIG. 6A.

FIG. 6B is a timing diagram that illustrates that the chop signals Chop A and Chop B and the ping-pong signal Ping can have the same timing relationships in the ping-pong amplifier 60 as shown in FIG. 4B.

Figure 6C:
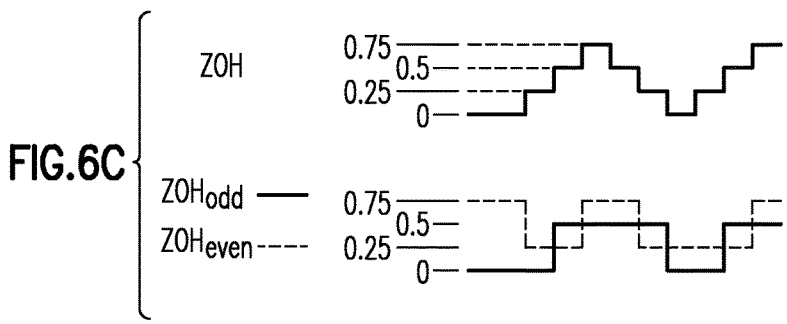
FIG. 6C is a timing diagram that illustrates example zero-order hold signals for the ping-pong amplifier of FIG. 6A according to an embodiment.

FIG. 6C is a timing diagram that illustrates example zero-order hold signals according to an embodiment. A zero-order hold signal ZOH can be a stepped signal. As discussed above, the zero-order hold signal ZOH can be provided by a digital-to-analog converter, for example. The first zero-order hold signal $ZOH_{EVEN}$ and the second zero-order hold signal $ZOH_{ODD}$ can each correspond to alternating signal levels of the zero-order hold signal ZOH. The first zero-order hold signal $ZOH_{EVEN}$ can be generated by sampling every other signal level of the zero-order hold signal ZOH and the second zero-order hold signal $ZOH_{ODD}$ can be generated by sampling the signal levels of the zero-order hold signal ZOH between signal levels sampled to generate the first zero-order hold signal $ZOH_{EVEN}$.

Figure 6D:
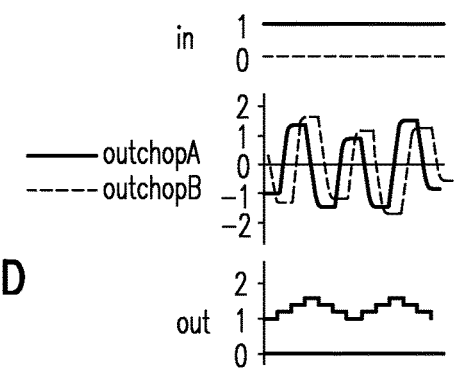
FIG. 6D is a timing diagram of the signals of the ping-pong amplifier of FIG. 6A according to an embodiment.

With the first zero-order hold signal $ZOH_{EVEN}$ and the second zero-order hold signal $ZOH_{ODD}$ in the ping-pong amplifier 60 as arranged in FIG. 6A, the zero-order hold signal ZOH can be reproduced at the differential output $V_{OUT}$ of the ping-pong amplifier 60 with rapid zero-order hold transitions as shown in FIG. 6D.

FIG. 6D is a timing diagram of the outputs outchopA and outchopB of the differential amplifiers 22-1 and 22-2, respectively, of the chopper amplifier channels of the ping-pong amplifier 60 and the differential output $V_{OUT}$ of the ping-pong amplifier 60 according to an embodiment. The signals in FIG. 6D correspond to the ping-pong amplifier with signal timings as shown in FIGS. 6B and 6C. As shown in FIG. 6D, zero-order hold inputs can modify the signal level at which differential amplifiers 22-1 and 22-2 settle to during each chopping cycle. When the ping-pong transition occurs, the activated differential amplifier 22-1 or 22-2 has its output pre-charged to a signal level which allows for a rapid transition. The dynamics of such a transition can depend on the ratios of capacitances attached to the output node, switch resistances, the amplifier bandwidth, or any combination thereof. An optimized ping-pong amplifier design in accordance with the embodiment of FIG. 6A may have a significantly faster transition settling than a single channel chopper amplifier.

While ping-pong amplifiers with two chopper amplifier channels have been discussed with reference to FIGS. 1 to 6D for illustrative purposes, any of the principles and advantages discussed herein can be implemented in connection with ping-pong amplifiers having three or more parallel chopper amplifier channels. For example, a three channel ping-pong amplifier architecture will be discussed with reference to FIGS. 7A to 8B. In a multi-channel ping-pong amplifier architecture having three or more channels, two or more channels can be active while the remaining channel(s) are inactive. Inactive channel(s) can operate similarly to an inactive channel in the two-channel ping-pong amplifier. For instance, the inactive channel(s) can perform settling, auto-zeroing, power management, other operations, or any combination thereof. The active channels can have their outputs summed, averaged or otherwise weighted/combined to form the output of the ping-pong amplifier, which can reduce noise and/or other zero-mean errors. This can come at the expense of increased area and/or increased power consumption for having three or more chopper amplifier channels instead of two chopper amplifiers.

In certain applications, a ping-pong amplifier having three or more chopper amplifier channels may be a preferred design tradeoff. For example, using a three channel ping-pong with two active chopper amplifier channels and one inactive chopper amplifier channel, for example, in accordance with FIGS. 7A and/or 8A, can increase the power and area by about 1.5 times compared to a two channel ping-pong amplifier and can decrease noise by approximately the square root of 2. This is better than a typical noise-power relationship of noise voltage reduction by the square root of power increase. However, each chopper amplifier channel may desire a reduced settling time compared to a two channel ping-pong amplifier if the channel chopping frequency is unchanged and the number of active channels is greater than the number of inactive channels. For instance, in the illustrative three channel chopper amplifier 80 of FIG. 8A, each differential amplifier should settle in one sixth of the chop cycle compared to one quarter of the chop cycle in the two channel case discussed with reference to FIG. 6A. Accordingly, improved noise performance can be traded for faster settling requirements. Using a multiple-channel ping-pong can extend the boundaries of the power-settling-noise tradeoff curve, and may be the preferred design architecture for certain applications.

Figure 7A:
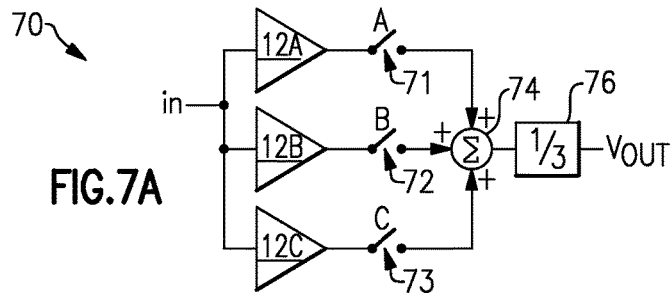
FIG. 7A is a schematic block diagram of an illustrative ping-pong amplifier that includes three chopper amplifier channels.

FIG. 7A is a schematic block diagram of an illustrative ping-pong amplifier 70 that includes three chopper amplifier channels. As illustrated, ping-pong amplifier 70 includes a first amplifier 12A, a second amplifier 12B, a third amplifier 12B, a first switch 71, a second switch 72, a third switch 73, a summer 74 and a divider 76. In FIG. 7A, three parallel amplifiers 12A, 12B, and 12C are in parallel between a shared input IN and a common output $V_{OUT}$. Each of the parallel amplifiers 12A, 12B, and 12C can be chopper amplifiers, such as the chopper amplifier 12' of FIG. 2A or the chopper amplifier 12" of FIG. 3. Each of these amplifiers can implement any of the principles and advantages discussed herein in connection with chopper amplifiers.

The first switch 71, the second switch 72, and the third switch 73 can alternatingly electrically couple and electrically decouple the output of the first amplifier 12A, the second amplifier 12B, and the third amplifier 12C, respectively, and the common output $V_{OUT}$. Two of the first switch 71, the second switch 72, and the third switch 73 can be on at a time and the other of the first switch 71, the second switch 72, and the third switch 73 can concurrently be off. The first switch 71 can be turned on responsive to a first control signal A being asserted (e.g., transitioning to a logic 1 value), the second switch 72 can be turned on responsive to a second control signal B being asserted (e.g., transitioning to a logic 1 value), and the third switch 73 can be turned on responsive to a third control signal C being asserted (e.g., transitioning to a logic 1 value).

Figure 7B:
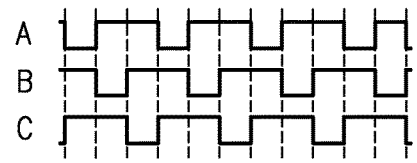
FIG. 7B is a timing diagram with illustrative control signals for the ping-pong amplifier 70 of FIG. 7A.

FIG. 7B is a timing diagram with illustrative control signals A, B, and C for the ping-pong amplifier 70 of FIG. 7A. As shown in FIG. 7B, two control signals can be asserted at a time while the other control signal is de-asserted. Each of the control signals can be asserted for two thirds of a ping-pong cycle as illustrated. The chop signals for each of the amplifiers 12A, 12B, and 12C can have a frequency that is half of the frequency of the control signals A, B, and C, for example.

The summer 74 can sum outputs of the amplifiers 12A, 12B, and 12C provided by the switches 71, 72, and 73, respectively. The divider 76 can then divide an output of the summer 74 to average the outputs of the amplifiers 12A, 12B, and 12C to provide the common output $V_{OUT}$ of the ping-pong amplifier 70.

Figure 8A:
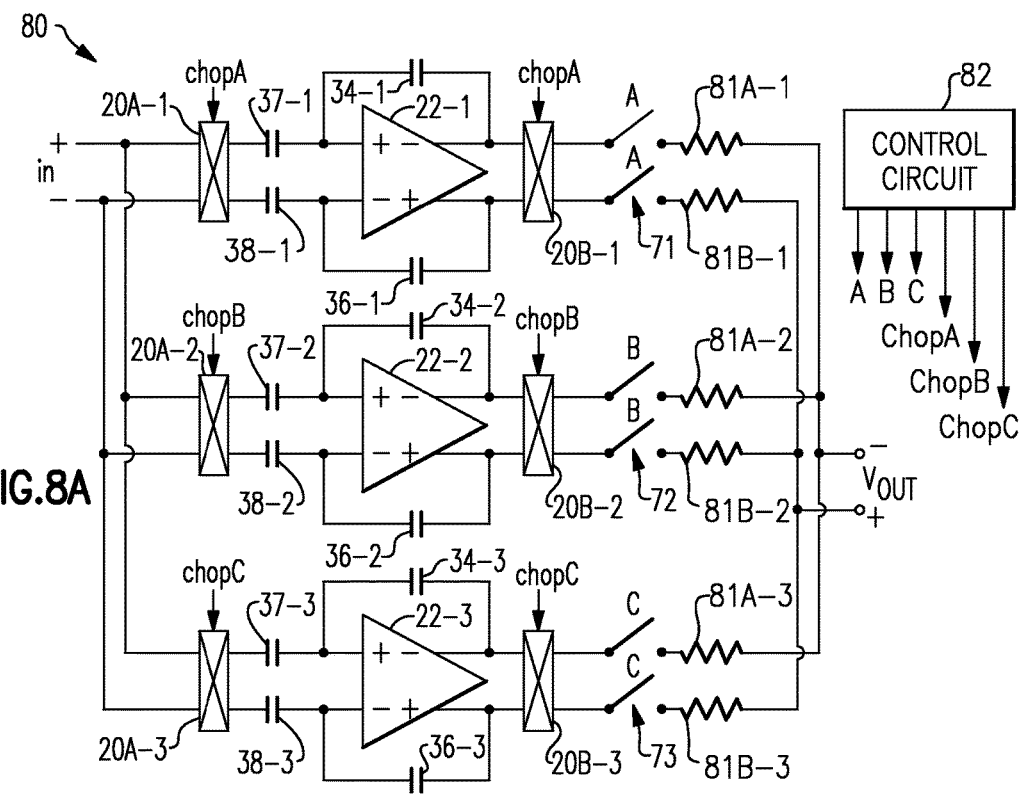
FIG. 8A is a schematic diagram of a three channel ping-pong amplifier according to an embodiment.

FIG. 8A is a schematic diagram of a three channel ping-pong amplifier 80 according to an embodiment. The ping-pong amplifier 80 is an illustrative embodiment of the ping-pong amplifier 70 of FIG. 7A. The illustrated ping-pong amplifier 80 includes three parallel channels between a shared input In and a common output $V_{OUT}$. As illustrated in FIG. 8A, each channel of the ping-pong amplifier 80 includes a chopper amplifier of FIG. 3. The three channel ping-pong amplifier 80 is similar to the two channel ping pong amplifier 40 of FIG. 4A applied to three channels. With the third chopper amplifier channel, the ping-pong amplifier 80 can include a different arrangement of switches to selectively electrically couple outputs of chopper amplifier channels to the common output $V_{OUT}$ of the ping-pong amplifier 80.

The first switch 71, the second switch 72, and the third switch 73 can alternatingly electrically couple and electrically decouple the output of the first chopper amplifier, the second chopper amplifier, and the third chopper amplifier, respectively, and the common output $V_{OUT}$. Two of the first switch 71, the second switch 72, and the third switch 73 can be on at a time and the other of the first switch 71, the second switch 72, and the third switch 73 can concurrently be off. Each of the first switch 71, the second switch 72, and the third switch 73 can be implemented by any suitable switch element, such as a pair of transistors, coupled between a chopper amplifier and the common output $V_{OUT}$. The first switch 71, the second switch 72, and the third switch 73 can implement a multiplexer in which inputs to two of the switches are combined at a common output of the switches 71 to 73 at a time.

Resistors 81A-1 and 81B-1 are coupled between the the first switch 71 and the common output $V_{OUT}$. Such resistors can provide a voltage drop between the output of the first switch 71 and common output $V_{OUT}$. Similar resistors are also illustrated between the second and third switches 72 and 73, respectively, and the common output $V_{OUT}$.

The output chop circuits 20B-1, 20B-2, and 20B-3 and the switches 71, 72, and 73, respectively, are illustrated separately in FIG. 8A to show their logical functions for illustrative purposes. However, any suitable switch network can implement the logical functions of the output chop circuits 20B-1, 20B-2, and 20B-3 and the switches 71, 72, and 73. As one example, a suitable switch network can be arranged in accordance with the principles and advantages discussed with reference to FIG. 4D. The switch network can also implement the input chop circuits 20A-1, 20A-2, and 20A-3 with additional switches in certain applications.

Figure 8B:
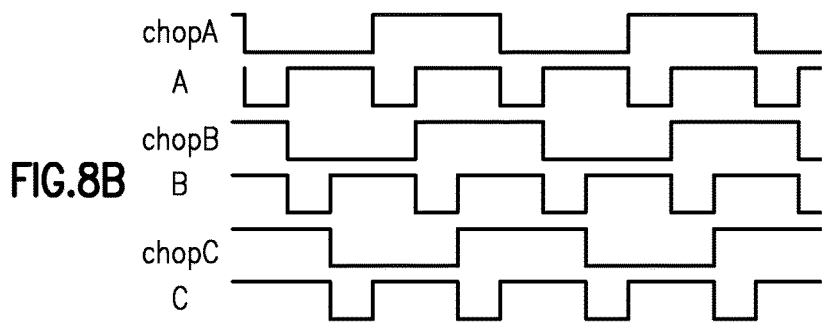
FIG. 8B is an example timing diagram of the chop signals and the control signals for the ping-pong amplifier of FIG. 8A.

FIG. 8B is an example timing diagram of the chop signals Chop A, Chop B, and Chop C and the control signals A, B, and C of the ping-pong amplifier 80. Such signals can be provided to the ping-pong amplifier 80 by the control circuit 82 of FIG. 8A. The control circuit 82 can be any suitable circuit configured to generate such signals. As illustrated in FIG. 8B, the chop signals Chop A, Chop B, and Chop C and the ping-pong signals A, B, and C can each be periodic signals. The ping-pong signals A, B, and C can have twice frequency of the chop signals Chop A, Chop B, and Chop C. The chop signals Chop A, Chop B, and Chop C can each have a duty cycle of about ⅔. The first chop signal Chop A and the second chop signal Chop B can have substantially the same frequency and can be offset in time from each other by approximately one quarter of the period of the chop signals. Similarly, the second chop signal Chop B and the third chop signal Chop C can have substantially the same frequency and can be offset in time from each other by approximately one quarter of the period of the chop signals. Moreover, the first chop signal Chop A and the third chop signal Chop C can have substantially the same frequency and can be offset in time from each other by approximately one half of the period of the chop signals.

As shown in FIG. 8B, two of the ping-pong signals A, B, and C can be asserted at a time such that outputs of two of the three channels of the ping-pong amplifier 80 are electrically connected to the output $V_{OUT}$ of the ping-pong amplifier 80. With the timing of chop signals and control signals shown in FIG. 8B, the differential output voltage of each chopper amplifier channel settles before being electrically connected to the output $V_{OUT}$ of the ping-pong amplifier 80 by way of the switch network. Accordingly, the ping-pong amplifier 80 can mask dynamic settling errors.

In the embodiments described above, apparatus, systems, and methods are described in connection with particular embodiments. It will be understood, however, that the principles and advantages of the embodiments can be used for any other systems, apparatus, or methods with a need for a ping-pong amplifier. Moreover, while some logic circuits are provided for illustrative purposes, other logically equivalent circuits can alternatively be implemented to achieve the functionality described herein.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include amplifier circuits, clocking circuits, analog-to-digital converts, rectifiers, programmable filters, attenuators, variable frequency circuits, etc. Examples of the electronic devices can also include memory chips, memory modules, circuits of optical networks or other communication networks, and disk driver circuits. Consumer electronic products can include, but are not limited to, wireless devices, a mobile phone (for example, a smart phone), cellular base stations, a telephone, a television, a computer monitor, a computer, a hand-held computer, a tablet computer, a laptop computer, a personal digital assistant (PDA), an automotive or other vehicular electronics system, a healthcare monitoring system, a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a wrist watch, a smart watch, a clock, a wearable health monitoring device, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A method of masking dynamic settling errors associated with chopper amplifiers, the method comprising:
amplifying an input signal with at least a first chopper amplifier and a second chopper amplifier arranged in parallel with the first chopper amplifier;
decoupling the first chopper amplifier from an output node for a period of time during which an output voltage of the first chopper amplifier settles to mask dynamic settling errors associated with the output voltage of the first chopper amplifier settling; and
decoupling the second chopper amplifier from the output node for a period of time during which an output voltage of the second chopper amplifier settles to mask dynamic settling errors associated with the output voltage of the second chopper amplifier settling.

2. The method of claim 1, further comprising repeatedly coupling the first chopper amplifier to the output node and decoupling the first chopper amplifier from the output node at a higher frequency than a frequency of a chop signal provided to the first chopper amplifier.

3. The method of claim 1, further comprising coupling the first chopper amplifier to the output node for a period of time during which the output voltage of the first chopper amplifier has a substantially constant voltage level after settling.

4. The method of claim 1, wherein said decoupling the first chopper amplifier comprises decoupling the first chopper amplifier from the output node twice during a period of a chop signal provided to the first chopper amplifier.

5. The method of claim 1, wherein the first chopper amplifier comprises a feedback amplifier.

6. The method of claim 1, wherein said amplifying comprises amplifying a combination of the input signal and a zero-order hold signal.

7. The method of claim 1, wherein the output voltage of the first chopper amplifier has a settling time requirement of at least one sixth of a period of a first chop signal provided to the first chopper amplifier, and wherein the output voltage of the second chopper amplifier has a settling time requirement of at least one sixth of a period of a second chop signal provided to the second chopper amplifier.

8. The method of claim 1, further comprising alternatingly coupling a third chopper amplifier to and decoupling the third chopper amplifier from the output node, and wherein said amplifying includes amplifying the input signal with the third chopper amplifier.

9. An apparatus for amplifying an input signal and masking dynamic settling errors associated with chopper amplifiers, the apparatus comprising:
a first chopper amplifier configured to amplify an input signal;
a second chopper amplifier configured to amplify the input signal;
differential output nodes configured to provide a differential voltage; and
a switch network configured to:
decouple the first chopper amplifier from the differential output nodes for a duration of time during which an output voltage of first chopper amplifier settles; and
decouple the second chopper amplifier from the differential output nodes for a duration of time during which an output voltage of second chopper amplifier settles,
wherein the output voltage of the first chopper amplifier has a settling time requirement of at least one sixth of a period of a first chop signal of the first chopper amplifier, and
wherein the output voltage of the second chopper amplifier has a settling time requirement of at least one sixth of a period of a second chop signal of the second chopper amplifier.

10. The apparatus of claim 9, wherein the first chopper amplifier comprises a feedback amplifier.

11. The apparatus of claim 10, wherein the feedback amplifier comprises a capacitive feedback element disposed between an output terminal of the feedback amplifier and an input terminal of the feedback amplifier.

12. The apparatus of claim 11, wherein the first chopper amplifier comprises an input chop circuit and an input capacitor coupled between the input chop circuit and the input terminal of the feedback amplifier.

13. The apparatus of claim 9, wherein the switch network is configured to couple the first chopper amplifier to the output node such that the first chopper amplifier is alternatingly coupled to and decoupled from the output node at about two times a chop frequency of the first chopper amplifier.

14. The apparatus of claim 9, wherein the second chop signal has the same period as the first chop signal, and wherein the first chop signal and the second chop are offset in time from each other by one quarter of the period of the second chop signal.

15. The apparatus of claim 9, wherein the switch network is configured such that a continuous output is provided at the differential output nodes.

16. The apparatus of claim 9, further comprising a third chopper amplifier configured to amplify the input signal, wherein the switch network is configured to couple two of the first chopper amplifier, the second chopper amplifier, and the third chopper amplifier to the differential output nodes concurrently.

17. The apparatus of claim 9, wherein the switch network is configured to implement an output chop circuit of the first chopper amplifier.

18. An apparatus for amplifying an input signal and masking dynamic settling errors associated with chopper amplifiers, the apparatus comprising:
a first chopper amplifier comprising a first feedback amplifier, the first chopper amplifier configured to amplify the input signal, and the first chopper amplifier further configured to provide a first chopper amplifier output voltage;
a second chopper amplifier comprising a second feedback amplifier, the second chopper amplifier arranged in parallel with the first chopper amplifier, and the second chopper amplifier further configured to provide a second chopper amplifier output voltage; and
means for switching an output node to at least the first chopper amplifier and the second chopper amplifier so as to mask dynamic settling errors associated with the first chopper amplifier output voltage and the second chopper amplifier output voltage.

19. The apparatus of claim 18, wherein the means for switching is configured to alternatingly couple the first chopper amplifier to and decouple the first chopper amplifier from the output node twice during a chop cycle of the first chopper amplifier.

20. The apparatus of claim 18, wherein the first feedback amplifier comprises a capacitor electrically coupled between an input terminal of the first feedback amplifier and an output terminal of the first feedback amplifier.

* * * * *